(12) United States Patent
Chen et al.

(10) Patent No.: US 10,878,890 B1
(45) Date of Patent: Dec. 29, 2020

(54) OPERATION ASSIST CIRCUIT, MEMORY DEVICE AND OPERATION ASSIST METHOD

(71) Applicant: Taiwan Semiconductor Manufacturing Co., Ltd., Hsinchu (TW)

(72) Inventors: Chien-Yuan Chen, Hsinchu (TW); Cheng-Hung Lee, Hsinchu (TW); Hung-Jen Liao, Hsin-Chu (TW); Hau-Tai Shieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/546,279

(22) Filed: Aug. 20, 2019

(51) Int. Cl.
*G11C 11/4097* (2006.01)
*G11C 11/4094* (2006.01)
*G11C 11/4074* (2006.01)
*G11C 7/12* (2006.01)

(52) U.S. Cl.
CPC .......... *G11C 11/4097* (2013.01); *G11C 7/12* (2013.01); *G11C 11/4074* (2013.01); *G11C 11/4094* (2013.01)

(58) Field of Classification Search
CPC .......... G11C 11/4097; G11C 11/4074; G11C 11/4094; G11C 7/12
USPC ........................................................ 365/203
See application file for complete search history.

(56) References Cited

U.S. PATENT DOCUMENTS

| | | | | |
|---|---|---|---|---|
| 7,307,905 | B2 * | 12/2007 | Najm | G11C 7/062 365/154 |
| 10,236,055 | B1 * | 3/2019 | Kumar | G11C 7/12 |
| 2003/0063493 | A1 * | 4/2003 | Yokozeki | G11C 11/4094 365/189.07 |
| 2003/0132457 | A1 * | 7/2003 | Lee | G11C 7/18 257/203 |
| 2004/0042275 | A1 * | 3/2004 | Yoshizawa | G11C 7/06 365/189.07 |
| 2006/0114711 | A1 * | 6/2006 | Khellah | G11C 11/419 365/154 |
| 2007/0002617 | A1 * | 1/2007 | Houston | H01L 27/1104 365/185.07 |

(Continued)

*Primary Examiner* — Sung Il Cho
(74) *Attorney, Agent, or Firm* — JCIPRNET

(57) ABSTRACT

An operation assist circuit includes a precharge and equalization circuit, a first sharing switch and a second sharing switch. The precharge and equalization circuit is coupled between a first dummy bit line and a second dummy bit line of a dummy bit line pair and configured to precharge and equalize the first dummy bit line and the second dummy bit line. The first sharing switch is coupled between a first bit line of a bit line pair and the first dummy bit line of the dummy bit line pair. The first sharing switch is configured to control an electrical connection between the first bit line of the first bit line pair and the first dummy bit line of the dummy bit line pair according to a charge sharing control signal. The second sharing switch, coupled between a second bit line of the bit line pair and the second dummy bit line of the dummy bit line pair. The second sharing switch is configured to control an electrical connection between the second bit line of the bit line pair and the second dummy bit line of the dummy bit line pair according the charge sharing control signal.

18 Claims, 7 Drawing Sheets

(56) References Cited

U.S. PATENT DOCUMENTS

| | | | | |
|---|---|---|---|---|
| 2009/0034336 A1* | 2/2009 | Kwak | ............... | H01L 27/11519 |
| | | | | 365/185.17 |
| 2012/0206988 A1* | 8/2012 | Song | .................... | G11C 11/419 |
| | | | | 365/203 |
| 2013/0028032 A1* | 1/2013 | Koike | .................. | G11C 11/413 |
| | | | | 365/189.15 |
| 2014/0071745 A1* | 3/2014 | Kawasumi | ........... | G11C 13/004 |
| | | | | 365/158 |
| 2019/0147944 A1* | 5/2019 | Pulluru | ................ | G11C 11/418 |
| | | | | 365/203 |

* cited by examiner

US 10,878,890 B1

OPERATION ASSIST CIRCUIT, MEMORY DEVICE AND OPERATION ASSIST METHOD

BACKGROUND

In a memory device, an operation assist circuit are usually adapted to improve stability of a read or a write operation that is performed to at least one memory cell of the memory device. A negative bit line scheme or a boost word line scheme is commonly used in a design of the operation assist circuit. However, problems of the negative bit line scheme and the boost word line scheme may be area overhead and power consumption. In addition, a static noise margin (SNM) of the above schemes are not good.

As demand for high reliability and low power consumption of a memory device has grown recently, there has grown a need for more creative techniques for an operation assist circuit and a memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
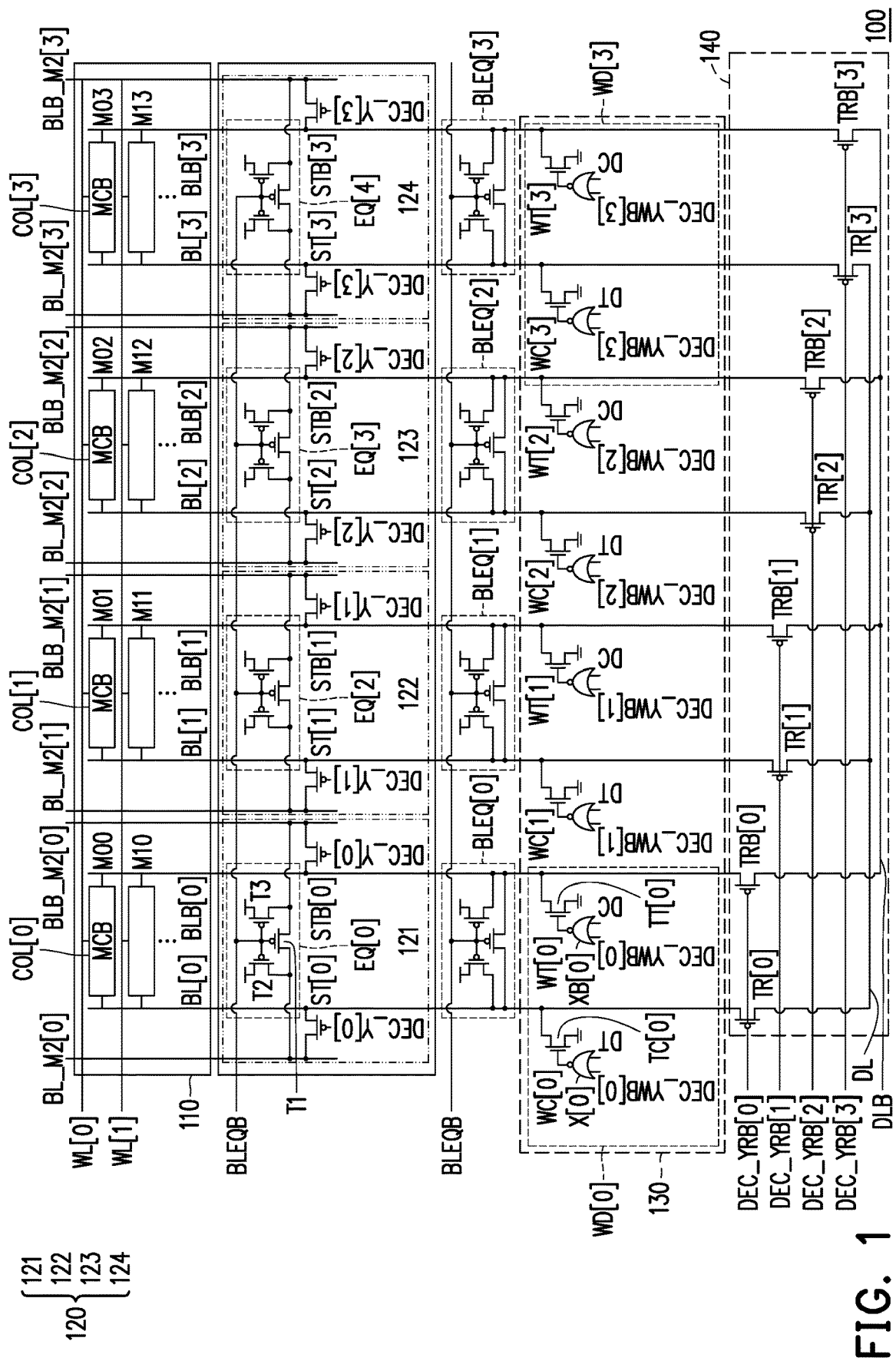
FIG. 1 is a schematic diagram illustrating a memory device having an operation assist circuit in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic diagram of a memory device 100 in accordance with some embodiments. The memory device 100 may include a memory array 110, an operation assist circuit 120, a plurality of precharging and equalization circuits BLEQ[0] through BLEQ[3], a write driver 130 and a sense amplifier 140. The memory array 110 may include a plurality of memory columns COL[0] through COL[3], in which each of the memory columns COL[0] through COL[3] may include a bit line pair and a dummy bit line pair. For example, the memory column COL[0] may include a bit line pair (BL[0] and BLB[0]) and a dummy bit line pair (BL_M2[0] and BLB_M2[0]). The memory column COL[3] may include a bit line pair (BL[3] and BLB[3]) and a dummy bit line pair (BL_M2[3] and BLB_M2[3]).

In some embodiments, each of the memory columns COL[0] through COL[3] includes a plurality of memory cells being coupled to the bit line pair of each of the memory columns COL[0] through COL[3]. For example, the memory column COL[0] includes a column of memory cells having memory cells M00 and M01, in which the memory cells M00 and M10 are coupled to the bit line pair (BL[0] and BLB[0]). The memory column COL[3] includes a column of memory cells having memory cells M03 and M13, in which the memory cells M03 and M13 are coupled to the bit line pair (BL[3] and BLB[3]). In some embodiments, the memory cells of each of the memory columns COL[0] through COL[3] are coupled to a plurality of word lines. For example, in the memory column COL[0], the memory cell M00 is coupled to the word line WL[0] and the memory cell M01 is coupled to the word line WL[1]. In some embodiments, the memory array 110 is a static random access memory (SRAM) array and the memory cells of the memory array 110 are SRAM cells, but the disclosure is not limited thereto.

In some embodiments, the operation assist circuit 120 is coupled to the memory array 110, and is configured to assist an operation performed on at least one memory cell of the memory array 110. The operation performed on the at least one memory cell of the memory array 110 may be a read operation or a write operation or any other operation that may be assisted by the operation assist circuit 120. The operation assist circuit 120 may include a plurality of column assist circuits 121 through 124, in which each of the column assist circuits 121 through 124 corresponds to one of the memory columns COL[0] through COL[3] of the memory array 110. In some embodiments, each of the column assist circuits 121 through 124 is configured to assist the operation performed to the corresponding memory column. For example, the column assist circuit 121 corresponds to the memory column COL[0], and is configured to assist the operation performed to the memory column COL[0]. Similarly, the column assist circuit 124 corresponds to the memory column COL[3], and is configured to assist the operation performed to the memory column COL[3].

In some embodiments, each of the column assist circuits 121 through 124 includes a precharging and equalization circuit and a sharing switch pair. For example, the column assist circuit 121 includes a precharging and equalization circuit EQ[0] and the sharing switch pair ST[0] and STB[0]. The precharging and equalization circuit EQ[0] is coupled between the dummy bit line pair (BL_M2[0] and BLB_M2[0]), and is configured to precharge and equalize electric charges in the dummy bit line pair (BL_M2[0] and BLB_M2[0]) according to a precharing and equalization control signal BLEQB.

In some embodiments, the precharging and equalization circuit EQ[0] may include a plurality of transistors T1 through T3, in which the transistor T1 is coupled between the dummy bit line BL_M2[0] and the dummy bit line BLB_M2[0]. The transistor T2 is coupled between a reference node (e.g., Vdd) and a connection node between the transistor T1 and the dummy bit line BL_M2[0]. The transistor T3 is coupled between a reference node (e.g., Vddd) and a connection node between the transistor T1 and the dummy bit line BLB_M2[0]. The control terminals of the transistors T1 through T3 are coupled to each other and are configured to receive the precharging and equalization control signal BLEQB. The transistors T1 through T3 are controlled by the precharging and equalization control signal BLEQB.

In some embodiment, during a precharge period, the precharging and equalization control signal BLEQB is configured to turn on transistors T1 through T3, thereby precharging and equalizing the dummy bit line pair (BL_M2[0] and BLB_M2[0]) to a predetermined voltage level. The predetermined voltage level may depend on a length of the precharge period.

In some embodiments, the sharing switch ST[0] is coupled between the bit line BL[0] and the dummy bit line BL_M2[0] and the sharing switch STB[0] is coupled between the bit line BLB[0] and the dummy bit line BLB_M2[0]. The sharing switch ST[0] is controlled by a sharing control signal DEC_Y[0] and is configured to share electric charges in the bit line BL[0] and the dummy bit line BL_M2[0] according to the sharing control signal DEC_Y[0]. The sharing switch STB[0] is controlled by the sharing control signal DEC_Y[0] and is configured to share electric charges in the bit line BLB[0] and the dummy bit line BLB_M2[0] according to the sharing control signal DEC_Y[0].

During a charge sharing period, the sharing control signal DEC_Y[0] may control to switch on or off the sharing switches ST[0] and STB[0], thereby electrically connecting or disconnecting the bit line pair (BL[0] and BLB[0]) from the dummy bit line pair (BL_M2[0] and BLB_M2[0]). More particularly, when the sharing switches ST[0] and STB[0] are switched on, the bit line BL[0] is electrically connected to the dummy bit line BL_M2[0] and the bit line BLB[0] is electrically connected to the dummy bit line BLB_M2[0]. When the sharing switches ST[0] and STB[0] are switched off, the bit line BL[0] is electrically disconnected from the dummy bit line BL_M2[0] and the bit line BLB[0] is electrically disconnected from the dummy bit line BLB_M2[0].

Each of the operation assist circuits 122 through 124 has a similar structure as the operation assist circuit 121, thus the detailed description about the operation assist circuits 122 through 124 are omitted hereafter. In some embodiments, the plurality of precharging and equalization circuits BLEQ[0] through BLEQ[3] are coupled to the memory column COL[0] through COL[3], respectively. A structure of each of the precharging and equalization circuits BLEQ[0] through BLEQ[3] may be similar to the structure of each of the precharging and equalization circuits EQ[0] through EQ[3] of the operation assist circuit 120. Each of the precharging and equalization circuits BLEQ[0] through BLEQ[3] is configured to precharge and equalize electric charges of a pair of bit lines in a memory column among the memory column COL[0] through COL[3]. For example, the precharging and equalization circuits BLEQ[0] is coupled between the bit lines BL[0] and BLB[0], and is configured to pre-charge and equalize the electric charges in the bit lines BL[0] and BLB[0] according to a precharging and equalization signal BLEQB. In some embodiments, the precharging and equalization control signal BLEQB for controlling the precharging and equalization circuits BLEQ[0] through BLEQ[3] is same as the precharging and equalization control signal BLEQB for controlling the precharging and equalization circuits EQ[0] through EQ[3] of the operation assist circuit 120, but the disclosure is not limited thereto.

In some embodiments, the write driver 130 is coupled to the bit line pairs (BL[0] and BLB[0]) through (BL[3] and BLB[3]) of the memory array 110, and is configured to control a write operation that is performed to at least one memory cell of the memory array 110. The write driver 130 may include a plurality of column write drivers WD[0] through WD[3], where each of the column write drivers WD[0] through WD[3] corresponds to one of the memory columns COL[0] through COL[3] of the memory array 110. For example, the column write driver WD[0] is coupled to the bit lines BL[0] and BLB[0] of the memory column COL[0], and is configured to control a write operation to at least one memory cell of the memory column COL[0]. Similarly, the column write driver WD[3] is coupled to the bit lines BL[3] and BLB[3] of the memory column COL[3], and is configured to control a write operation to at least one memory cell of the memory column COL[3].

In some embodiments, each of the column write drivers WD[0] through WD[3] includes a first write circuit coupled to one bit line of a pair of bit lines and a second write circuit coupled to the other one bit line of the pair of bit lines. For example, the first write circuit of the column write driver WD[0] is formed by the logic circuit X[0] and the transistor TC[0]; and the second write circuit of the column write driver WD[0] is formed by the logic circuit XB[0] and the transistor TT[0].

In some embodiments, the logic circuit X[0] is configured to receive signals DEC_YWB[0] and DT, and is configured to perform a logic operation to the received signals DEC_YWB[0] and DT to generate a signal WC[0]. The signal WC[0] is provided to a control terminal of the transistor TC[0] to control the transistor TC[0]. The transistor TC[0] is coupled between a reference node (e.g, ground node) and the bit line BL[0], and is controlled to be switched on or off according to the signal WC[0] received from the logic circuit X[0]. Similarly, the logic circuit XB[0] is configured to receive signals DEC_YWB[0] and DC, and is configured to perform a logic operation to the received signals DEC_YWB[0] and DC to generate a signal WT[0]. The signal WT[0] is provided to a control terminal of the transistor TT[0] to control the transistor TT[0]. The transistor TT[0] is coupled between a reference node (e.g, ground node) and the bit line BLB[0], and is controlled to be switched on or off according to the signal WT[0] received from the logic circuit XB[0]. In some embodiments, the logic circuits X[0] and XB[0] of the column write driver WD[0] are NOR logic gates that are configured to perform a NOR logic operation to the signals DEC_YWB[0] and DT to generate the signal WC[0] and to perform a NOR logic operation to the signals DEC_YWB[0] and DC to generate the signal WT[0].

In some embodiments, the sense amplifier 140 includes a plurality of transistor pairs (TR[0] and TRB[0]) through (TR[3] and TRB[3]), in which each of the transistor pairs (TR[0] and TRB[0]) through (TR[3] and TRB[3]) of the sense amplifier 140 corresponds to one of the memory columns COL[0] through COL[3] of the memory array 110. For example, the transistor pair (TR[0] and TRB[0]) corresponds to the memory column COL[0]; and the transistor pair (TR[3] and TRB[3]) corresponds to the memory column COL[3]. The transistor pairs (TR[0] and TRB[0]) through (TR[3] and TRB[3]) are controlled by read control signals DEC_YRB[0] through DEC_YRB[3], respectively.

In some embodiments, the transistor TR[0] is coupled to the bit line BL[0] and the transistor TRB[0] is coupled to the bit line BLB[0]. The transistors TR[0] and TRB[0] are controlled by the read control signal DEC_YRB[0]. As an example, during a read operation on at least on memory cell of the memory column COL[0], the read control signal DEC_YRB[0] may turn on the transistors TR[0] and TRB[0] (e.g., DEC_YRB[0]="1"), thereby electrically connecting the bit lines BL[0] and BLB[0] to the data lines DL and DLB. As such, the data stored in the at least one memory cell is read through the bit lines BL[0] and BLB[0]. Similarly, the transistors TR[3] and TRB[3] are coupled to the bit lines BL[3] and BLB[3], respectively, and the transistors TR[3] and TRB[3] are controlled by the read control signal DEC_YRB[3] to read at least one memory cell of the memory column COL[3].

Figure 2:
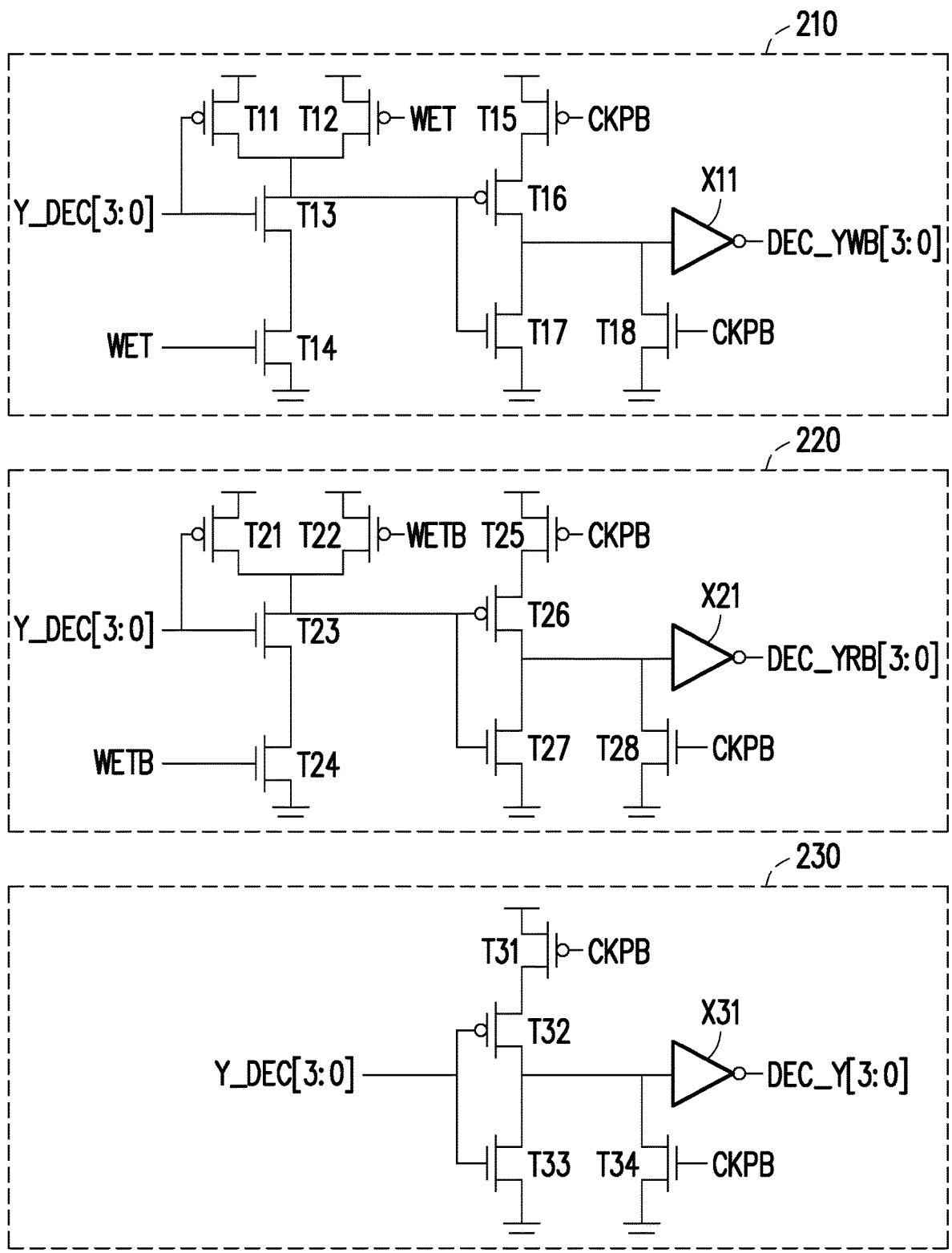
FIG. 2 is a schematic diagram illustrating a control logic of a memory device in accordance with some embodiments.

In some embodiments, the signals for controlling the operations of the memory device 100 such as a sharing control signal DEC_Y[3:0], a read control signal DEC_YRB [3:0] and a write control signal DEC_YWB[3:0] are generated by a control logic. FIG. 2 illustrates a control logic 200 in accordance with some embodiments is illustrated. In some embodiments, the control logic 200 includes a first control logic 210, a second control logic 220 and a third control logic 230.

The first control logic 210 is configured to receive a selection signal Y_DEC[3:0], a decode signal WET and a clock signal CKPB, and is configured to generate the write control signal DEC_YWB[3:0] according to the selection signal Y_DEC[3:0], the decode signal WET and the clock signals CKPB. In some embodiments, the first control logic 210 includes a plurality of transistors T11 through T18 and a logic circuit X11, in which control terminals of the transistors T11 and T13 receive the selection signal Y_DEC [3:0]; the control terminal of the transistor T14 receives the decode signal WET; and the control terminals of the transistors T15 and T18 receive the clock signal CKPB. A connection node of the transistors T16, T17 and T18 is coupled to an input terminal of the logic circuit X11; and the logic circuit X11 is configured to perform a logic operation to the signal received from the input terminal of the logic circuit X11. The logic circuit X11 outputs the write control signal DEC_YWB[3:0].

The second control logic 220 is configured to receive a selection signal Y_DEC[3:0], a decode signal WETB and a clock signal CKPB, and is configured to generate the read control signal DEC_YRB[3:0] according to the selection signal Y_DEC[3:0], the decode signal WETB and the clock signals CKPB. In some embodiments, the decode signal WETB is an inverted clock signal of the clock signal WET. The second control logic 220 may include a plurality of transistors T21 through T28 and a logic circuit X21, in which control terminals of the transistors T21 and T23 receive the selection signal Y_DEC[3:0]; the control terminal of the transistor T24 receives the decode signal WETB; and the control terminals of the transistors T25 and T28 receive the clock signal CKPB. A connection node of the transistors T26, T27 and T28 is coupled to an input terminal of the logic circuit X21; and the logic circuit X21 is configured to perform a logic operation to the signal received from the input terminal of the logic circuit X21. The logic circuit X21 outputs the read control signal DEC_YRB[3:0].

The third control logic 230 is configured to receive a selection signal Y_DEC[3:0] and a clock signal CKPB, and is configured to generate the sharing control signal DEC_Y [3:0] according to the selection signal Y_DEC[3:0] and the clock signal CKPB. The third control logic 230 may include a plurality of transistors T31 through T34 and a logic circuit X31. The transistors T31, T32 and T33 are coupled in series, in which the control terminals of the transistors T32 and T33 receive the selection signal Y_DEC[3:0] and the control terminals of the transistors T31 and T33 receive the clock signal CKPB. A connection node of the transistors T32, T33 and T34 is coupled to an input terminal of the logic circuit X31, and an output terminal of the logic circuit X31 output the sharing control signal DEC_Y[3:0].

In some embodiments, the logic circuits X11, X21 and X31 of the first control logic 210, the second control logic 220 and the third control logic 230 are NOT logic gate, but the disclosure is not limited thereto. In some embodiments, the selection signal Y_DEC[3:0] may indicate selected bit lines and unselected bit lines of the memory array. For example, a high logic state (e.g., logic state of "1") of the selection signal Y_DEC[3:0] indicates selected bit lines and a low logic state (e.g., logic state of "0") indicates unselected bit lines. In some embodiments, the decode signal WET and WETB may indicate an operation to be performed to the memory array. For example, in a read operation to the memory array, the decode signal WET has the low logic state (e.g., logic state of "0") and the decode signal WETB has the high logic state (e.g., logic state of "1"). In the write operation to the memory array, the decode signal WET has the high logic state (e.g., logic state of "1") and the decode signal WETB has the low logic state (e.g., logic state of "0").

Figure 3A:
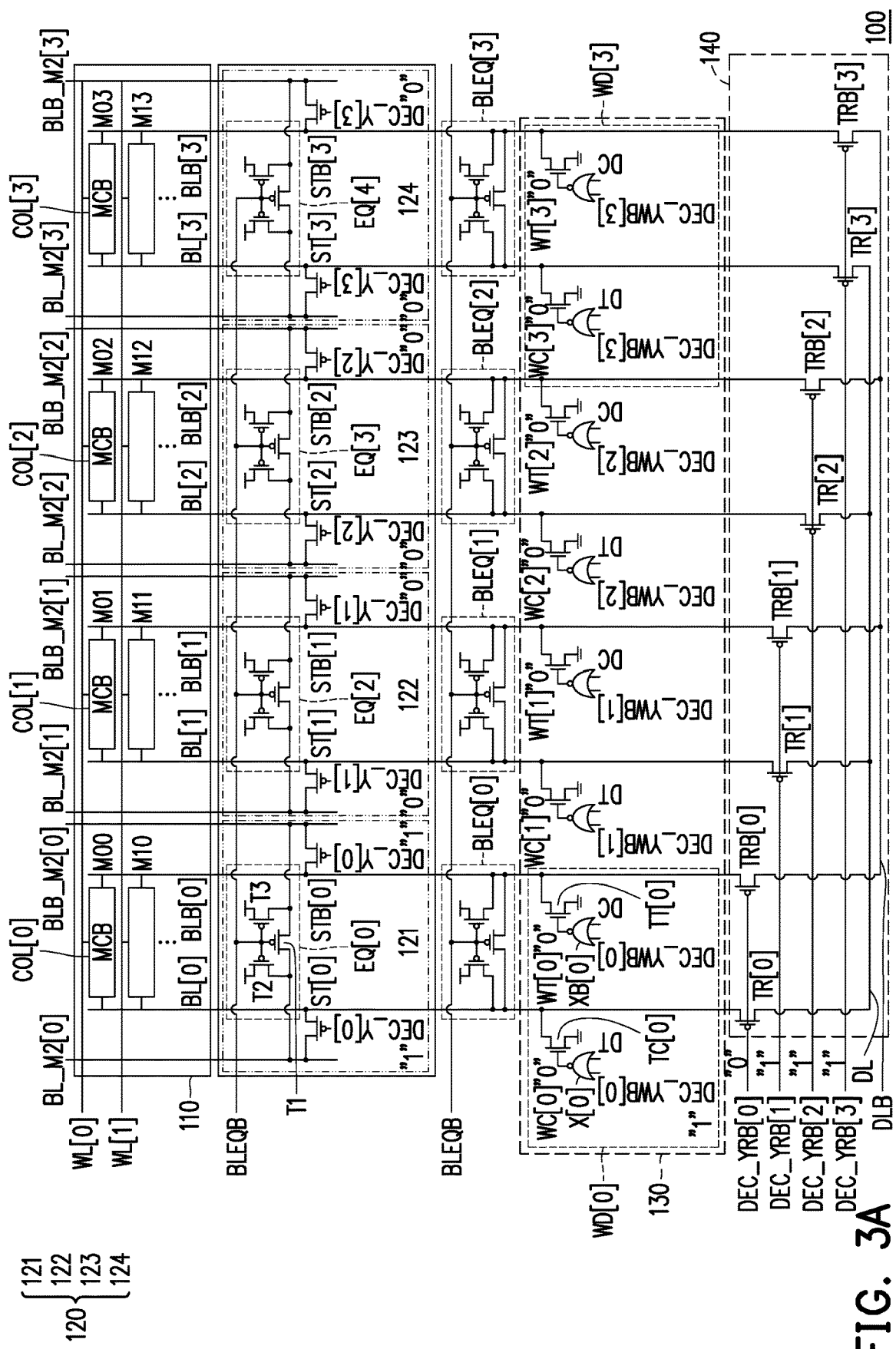
FIG. 3A is a schematic diagram illustrating a memory device during a read operation using a lower dummy read swing (LDRS) scheme in accordance with some embodiments.

FIG. 3A illustrates a memory device in a read operation using a lower dummy read swing (LDRS) scheme in accordance with some embodiments. Referring to FIG. 3A, it is assumed that the memory cell M00 of the memory column COL[0] is selected for the read operation. In other words, the memory cell M00 is the selected memory cell and the other memory cells are unselected memory cells; and the memory column COL[0] is the selected memory column and the other memory columns COL[1] through COL[3] are unselected memory columns. The bit line pair (BL[0] and BLB[0]) that is coupled to the selected memory column COL[0] is the selected bit line pair for the read operation; and the other bit line pairs (BL[1] and BLB[1]) through (BL[3] and BLB[3]) that are coupled to the unselected memory column COL[1] through COL[3] are unselected bit lines.

In some embodiments, to perform the read operation to the memory cell M00 of the memory column COL[0] using the LDRS scheme, the read control signal DEC_YRB[0] is configured to turned on the transistors TR[0] and TRB[0] (e.g., DEC_YRB[0]="0"), thereby electrically connecting the selected bit line pair (BL[0] and BLB[0]) to the data line pair (DL and DLB). The read control signal DEC_YRB[1] through DEC_YRB[3] are configured to electrically disconnect the unselected bit line pairs (BL[1] and BLB[1]) through (BL[3] and BLB[3]) from the data line pair (DL and DLB), e.g., DEC_YRB[1]–DEC_YRB[3]="1". Meanwhile, the write control signals DEC_YWB[0] through DEC_YWB[3] are configured to disable the write driver 130 during the read operation (e.g., DEC_YWB[0]–DEC_YWB [3]="0").

During a read period where the read operation is performed, the sharing control signal DEC_Y[0] is configured to switch off the sharing switches ST[0] and STB[0] of the column assist circuit 121, thereby electrically disconnecting the selected bit line pair (BL[0] and BLB[0]) from the dummy bit line pair (BL_M2[0] and BLB_M2[0]). As shown in FIG. 3A, the sharing control signal DEC_Y[0] is at the high logic state (e.g., "1"), thereby switching off the sharing switches ST[0] and STB[0]. Meanwhile, the sharing control signals DEC_Y[1] through DEC_Y[3] are configured to switch on the sharing switches ST[1] through ST[3] and STB[1] through STB[3] of the column assist circuit 122 through 124, thereby electrically connecting the unselected bit line pairs (BL[1] and BLB[1]) through (BL[3] and BLB[3]) to the dummy bit line pairs (BL_M2[1] and BL_M [3]) through (BLB_M2[1] and BLB_M2[3]), respectively. As shown in FIG. 3A, the sharing control signals DEC_Y[1] through DEC_Y[3] are at the low logic state (e.g., "0"), thereby switching on the sharing switches ST[1] through ST[3] and STB[1] through STB[3]. As a result of the electrical connections between the unselected bit line pairs (BL[1] and BLB[1]) through (BL[3] and BLB[3]) and the dummy bit line pairs (BL_M2[1] and BL_M[3]) through (BLB_M2[1] and BLB_M2[3]), the capacitance in each of the unselected bit line pairs (BL[1] and BLB[1]) through (BL[3] and BLB[3]) is increased. As the capacitance in each of the unselected bit lines increases, a coupling effect of the unselected bit pairs (BL[1] and BLB[1]) through (BL[3] and BLB[3]) to the word lines of the memory device is reduced.

Figure 3B:
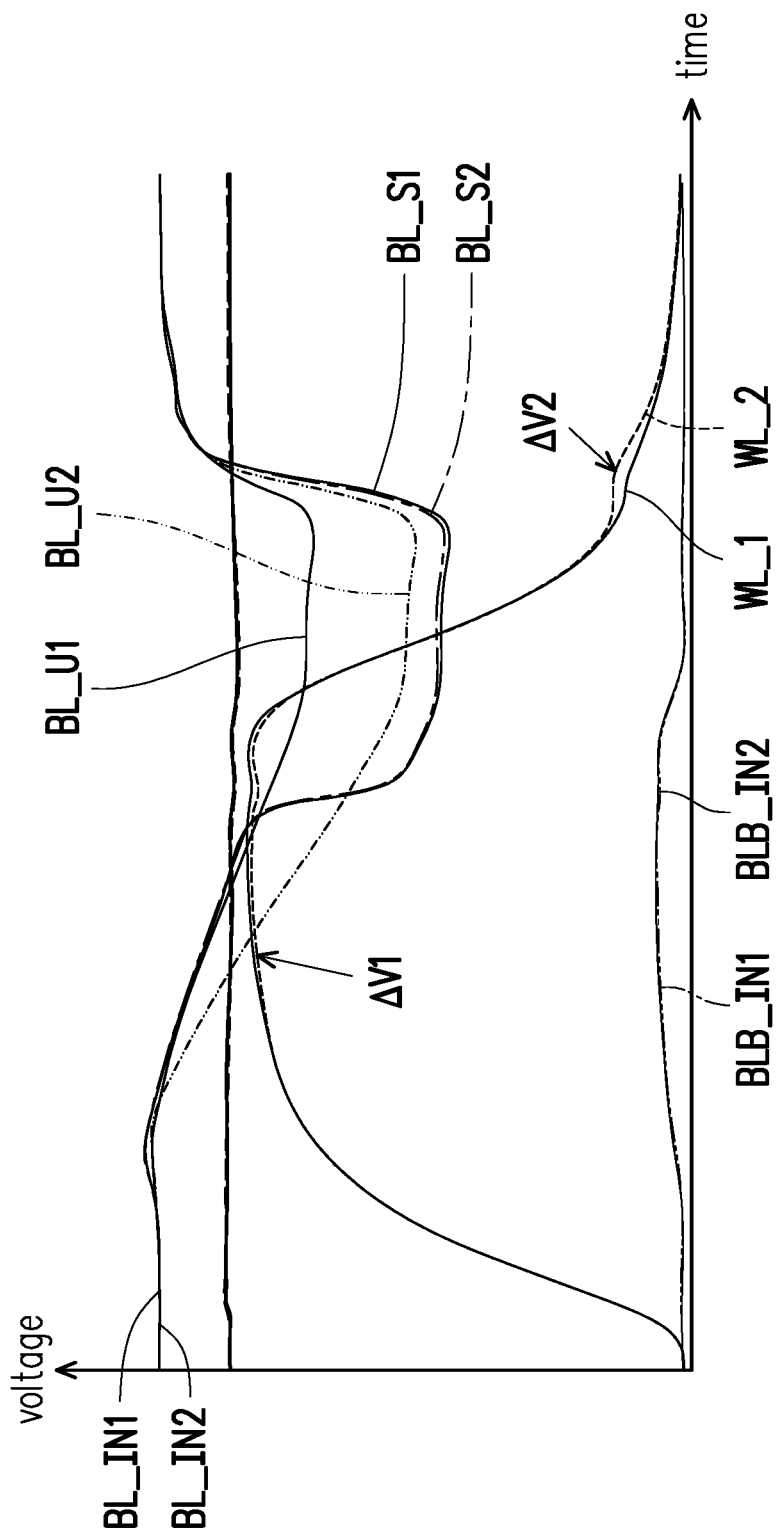
FIG. 3B is a timing diagram illustrating waveforms of signals in read operations using a LDRS scheme and a non-LDRS scheme accordance with some embodiments.

Referring to FIG. 3B, a timing diagram illustrating waveforms of signals in a read operation using a LDRS scheme (solid waveforms) and a non-LDRS scheme (dotted waveforms) is illustrated. FIG. 3B shows waveforms of signals BL_S1 and BL_S2 which are the bit line signals associated with a selected bit line, signals BL_U1 and BL_U2 which are the bit line signals associated with an unselected bit line, and signal WL_1 and WL_2 which are the word line signals. Referring to FIGS. 3A and 3B, the signal BL_S1 which is obtained by using the LDRS scheme is substantially same as the signal BL_S2 which is obtained by using the non-LDRS scheme, because the selected bit line pair (BL[0] and BLB [0]) are not influenced by capacitance caused by the dummy bit line pair (BL_M2[0] and BLB_M2[0]). As shown in FIG. 3A, the selected bit line pair (BL[0] and BLB[0]) are electrically disconnected from the corresponding dummy bit line pair (BL_M2[0] and BLB_M2[0]) by switching off the sharing switches ST[0] and STB[0] during the read operation.

As shown in FIG. 3B, the bit line signal BL_U1 which is obtained by using the LDRS scheme is significantly different from the bit line signal BL_U2 which is obtained by using the non-LDRS scheme. In other words, the read swing for the unselected bit lines in the LDRS scheme are lower than that of the non-LDRS scheme. This is because the capacitance of each of the unselected bit line pairs is increased due to the electrical connections between the unselected bit line pairs and the corresponding dummy bit line pairs. As shown in FIG. 3A, the unselected bit line pairs (BL[1] and BLB[1]) through (BL[3] and BLB[3]) are electrically connected to the dummy bit line pair (BL_M2[1] and BLB_M2[1]) through (BL_M2[3] and BLB_M2[3]) by switching on the sharing switches ST[1] through ST [3] and STB[1] through STB[3] during the read operation.

As the capacitance of the unselected bit line pair is increased, the coupling effect of the unselected bit line pairs to the word line is reduced. As such, the signal WL_1 in the word line using the LDRS scheme has a higher rising level than the signal WL_2 in the word line using the non-LDRS scheme. As shown in FIG. 3B, a voltage level of the signal WL_1 in a front edge (e.g., rising edge) coupling period is higher than a voltage level of the signal WL_2 an amount of AV1 at a time point. Furthermore, the voltage level of the signal WL_1 in the back edge (falling edge) coupling period is lower than the voltage level of the signal WL_2 an amount of AV2 at a time. As the signal WL_1 obtained by using the LDRS scheme has higher rising level and lower falling level than the signal WL_2, a read margin of the read operation using the LDRS scheme is better, and a power consumption for the read operation is reduced.

FIG. 3B further shows the waveforms of signals BL_IN1, BL_IN2, BLB_IN1 and BLB_IN2 which are the signals in nodes of the selected memory cell M00, in which the nodes of the selected memory cell are coupled to the selected bit line pair. During the read operation to the selected memory cell, the waveforms of signals BL_IN1, BL_IN2, BLB_IN1 and BLB_IN2 does not change, because in the read operation, the data stored in the selected memory cell does not change.

Figure 4A:
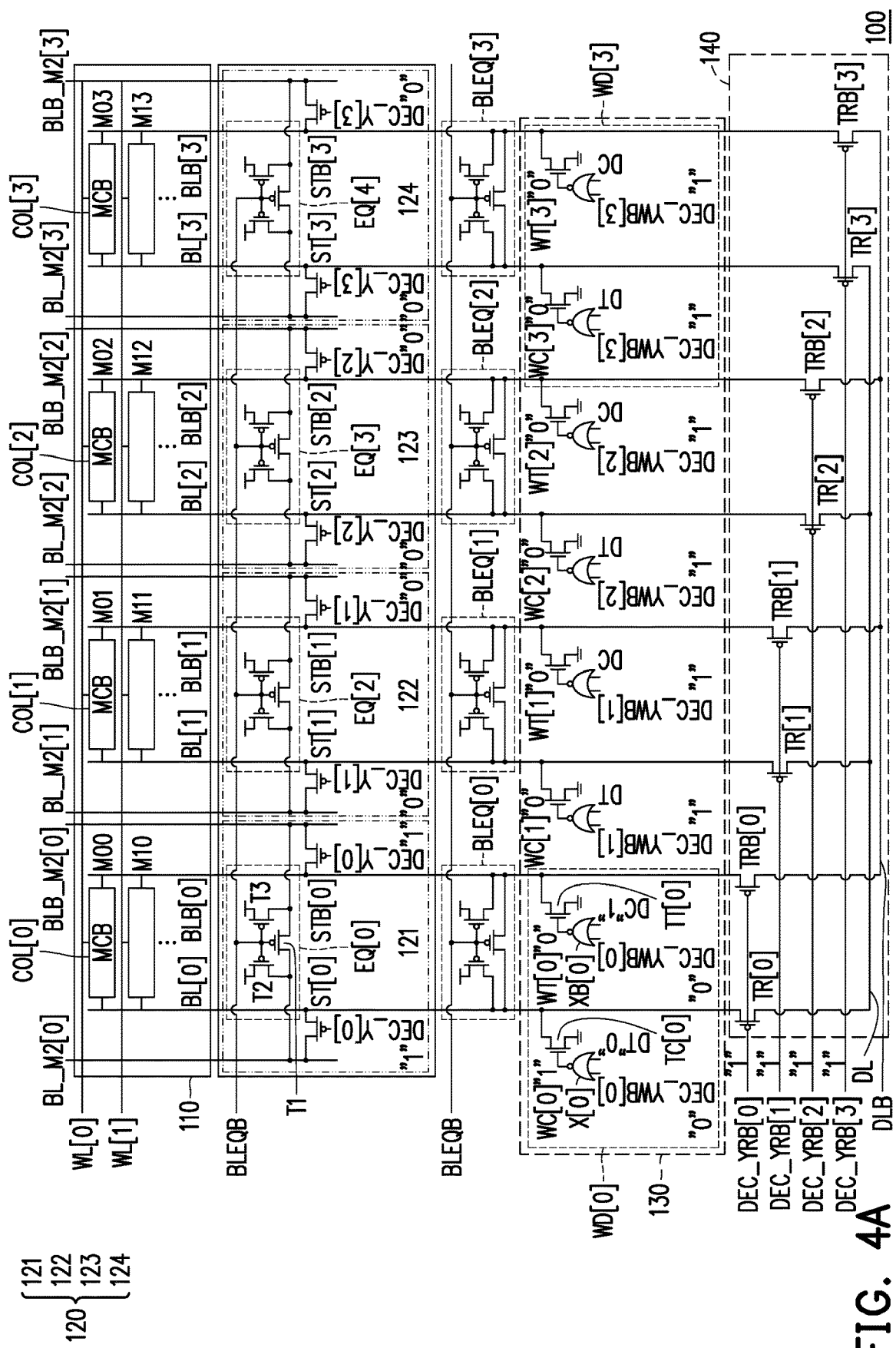
FIG. 4A is a schematic diagram illustrating a memory device during a write operation using the LDRS scheme in accordance with some embodiments.

FIG. 4A illustrates a memory device in a write operation using the LDRS scheme in accordance with some embodiments. Referring to FIG. 4A, it is assumed that the memory cell M00 of the memory column COL[0] are selected for the write operation. In other words, the memory cell M00 is the selected memory cell and the other memory cells are unselected memory cells for the write operation; and the memory column COL[0] is the selected memory column and the other memory columns COL[1] through COL[3] are unselected memory columns for the write operation. The bit line pair (BL[0] and BLB[0]) that is coupled to the selected memory column COL[0] is the selected bit line pair for the write operation; and the other bit line pairs (BL[1] and BLB[1]) through (BL[3] and BLB[3]) that are coupled to the unselected memory column COL[1] through COL[3] are unselected bit lines for the write operation.

In some embodiments, to perform the write operation to the memory cell M00 of the memory column COL[0] using the LDRS scheme, the write control signal DEC_YWB[0] is the write control signal DEC_YWB[0] is at the low logic state (e.g., "0") and the write control signals DEC_YWB[1] through DEC_YWB[3] are at the high logic state (e.g., "1"). As such, the column write driver associated with the selected memory column COL[0] is enabled for the write operation and the unselected memory columns COL[1] through COL [3] are disabled for the write operation. The write control signal DEC_YWB[0] and the signal DT are configured to control the logic circuit X[0] and the transistor TC[0] so as to write appropriate data to the memory cell M00.

Figure 4B:
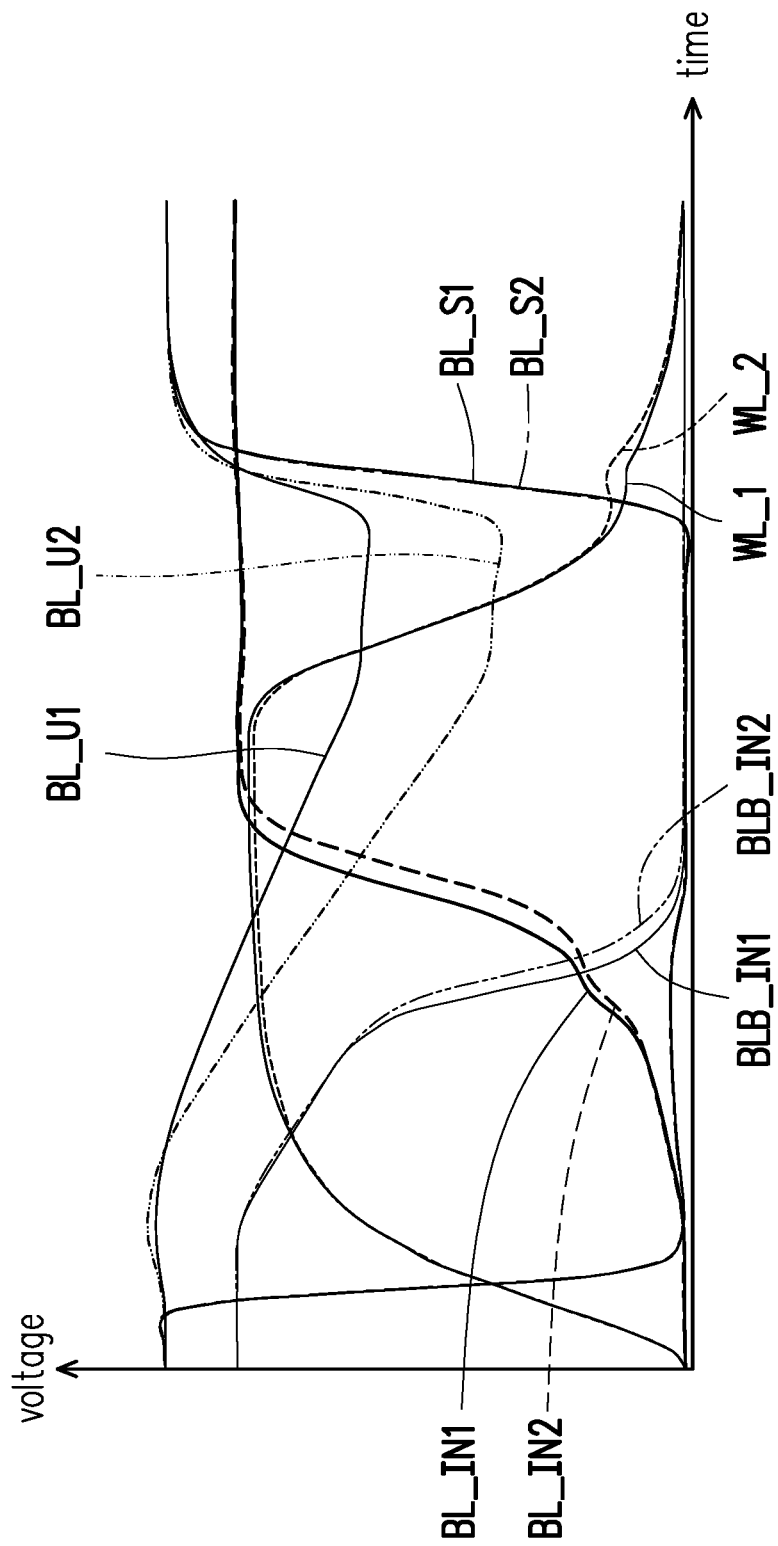
FIG. 4B is a timing diagram illustrating waveforms of signals of write operations using a LDRS scheme and a non-LDRS scheme in accordance with some embodiments.

During a write period when the write operation is performed to the memory cell M00 of the memory column COL[0] using the LDRS scheme, the sharing control signal DEC_Y[0] is configured to switched off the sharing switches ST[0] and STB[0], thereby electrically disconnecting the selected bit line pair (BL[0] and BLB[0]) from the dummy bit line pair (BL_M2[0] and BLB_M2[0]). As shown in FIG. 4A, the sharing control signal DEC_Y[0] is at the high logic state (e.g., "1"), thereby switching off the sharing switches ST[0] and STB[0]. Meanwhile, the sharing control signals DEC_Y[1] through DEC_Y[3] are configured to switched on the sharing switches ST[1] through ST[3] and STB[1] through STB[3], thereby electrically connecting the unselected bit line pairs (BL[1] and BLB[1]) through (BL[3] and BLB[3]) to the dummy bit line pairs (BL_M2[1] and BLB_M2[1]) through (BL_M2[3] and BLB_M2[3]), respectively. As shown in FIG. 4B, the sharing control signals DEC_Y[1] through DEC_Y[3] are at the low logic state (e.g., "0"), thereby switching on the sharing switches ST[1] through ST[3] and STB[1] through STB[3]. As a result of the electrical connections between the unselected bit line pairs (BL[1] and BLB[1]) through (BL[3] and BLB[3]) and the dummy bit line pairs (BL_M2[1] and BL_M[3]) through (BLB_M2[1] and BLB_M2[3]), the capacitance in each of the unselected bit line pairs (BL[1] and BLB[1]) through (BL[3] and BLB[3]) is increased. As the capacitance in each of the unselected bit lines increases, a coupling effect of the unselected bit pairs (BL[l] and BLB[1]) through (BL[3] and BLB[3]) to the word lines of the memory device is reduced.

Referring to FIG. 4B, a timing diagram illustrating waveforms of signals in a write operation using a LDRS scheme (solid waveforms) and a non-LDRS scheme (dotted waveforms) is illustrated. FIG. 4B shows waveforms of signals BL_S1 and BL_S2 which are the bit line signals associated with a selected bit line, signals BL_U1 and BL_U2 which are the bit line signals associated with an unselected bit line, signal WL_1 and WL_2 which are the word line signals, and signals BL_IN1, BL_IN2, BLB_IN1 and BLB_IN2 which are the signals at nodes of the selected memory cell.

Referring to FIGS. 4A and 4B, the signal BL_S1 which is obtained by using the LDRS scheme is substantially same as the signal BL_S2 which is obtained by using the non-LDRS scheme, because the selected bit line pair (BL[0] and BLB[0]) are not influenced by capacitance caused by the dummy bit line pair (BL_M2[0] and BLB_M2[0]). The bit line signal BL_U1 which is obtained by using the LDRS scheme drops less than the bit line signal BL_U2 which is obtained by using the non-LDRS scheme. This is because the capacitance of each of the unselected bit line pairs is increased because of the electrical connection between the unselected bit line pairs and the corresponding dummy bit line pairs.

As the capacitance of the unselected bit line pair is increased, the coupling effect of the unselected bit line pairs to the word line is reduced. As such, the signal WL_1 in the word line using the LDRS scheme has a higher rising level than the signal WL_2 in the word line using the non-LDRS scheme. As shown in FIG. 4B, a voltage level of the signal WL_1 in a front edge (e.g., rising edge) coupling period is higher than a voltage level of the signal WL_2. Furthermore, the voltage level of the signal WL_1 in the back edge (falling edge) coupling period is lower than the voltage level of the signal WL_2.

As shown in FIG. 4B, the signal BL_IN1 which is obtained by using the LDRS scheme rises to quicker than the signal BL_IN2 which is obtained by using the non-LDRS scheme during the write operation. Similarly, the signal BLB_IN1 which is obtained by using the LDRS scheme falls quicker than the signal BLB_IN2 which is obtained by using the non-LDRS scheme during the write operation. As such, a write margin of the write operation using the LDRS scheme is better than a write margin the write operation using the non-LDRS scheme. In other words, the performance of the write operation is better for the LDRS scheme, and the power consumption for the write operation using the LDRS scheme is reduced.

Figure 5:
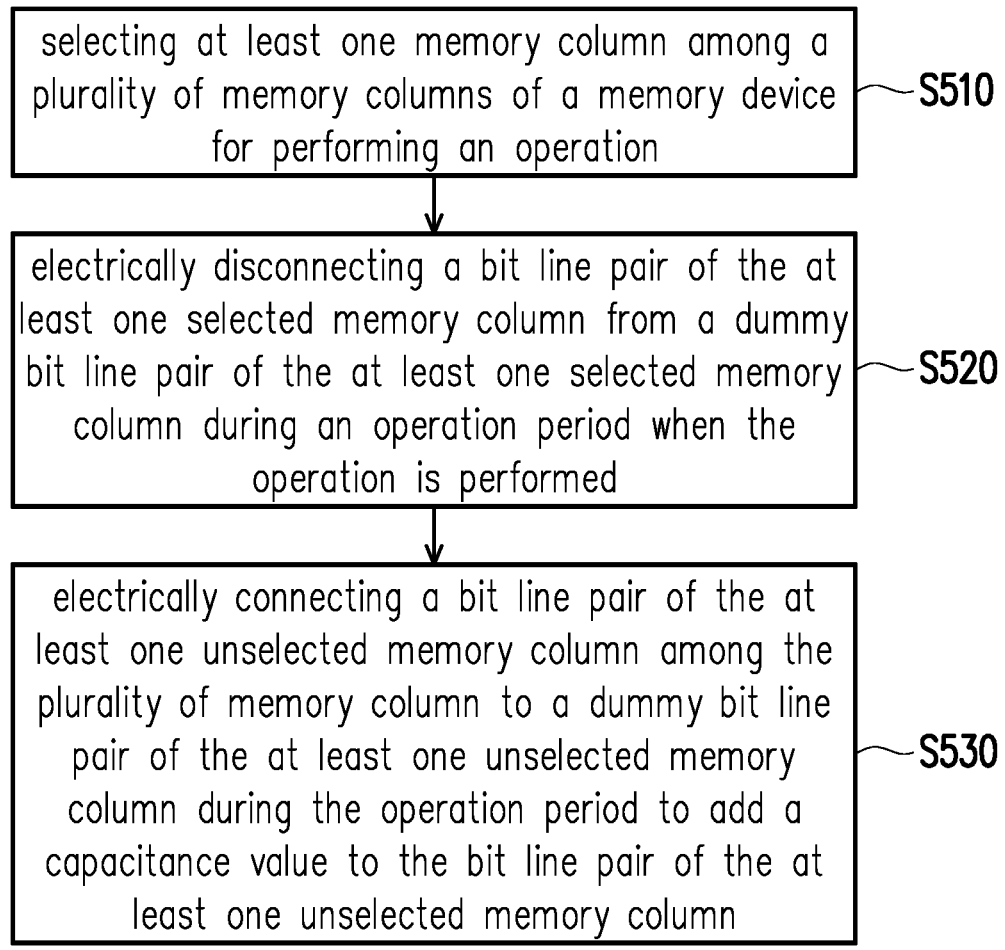
FIG. 5 is a flowchart illustrating an operation assist method in accordance with some embodiments.

Referring to FIG. 5, an operation assist method in accordance with some embodiments is illustrated. In step S510, at least one memory column among a plurality of memory columns of a memory device is selected for performing an operation. In some embodiments, the operation may include a read operation or a write operation. In step S520, a bit line pair of the at least one selected memory column is electrically disconnected from a dummy bit line pair of the at least one selected memory column during an operation period when the operation is performed. In step S530, a bit line pair of the at least one unselected memory column among the plurality of memory column is electrically connected to a dummy bit line pair of the at least one unselected memory column during the operation period to add a capacitance value to the bit line pair of the at least one unselected memory column.

In accordance with some embodiments, an operation assist circuit includes a precharge and equalization circuit, a first sharing switch and a second sharing switch. The precharge and equalization circuit is coupled between a first dummy bit line and a second dummy bit line of a dummy bit line pair and configured to precharge and equalize the first dummy bit line and the second dummy bit line. The first sharing switch is coupled between a first bit line of a bit line pair and the first dummy bit line of the dummy bit line pair. The first sharing switch is configured to control an electrical connection between the first bit line of the first bit line pair and the first dummy bit line of the dummy bit line pair according to a charge sharing control signal. The second sharing switch, coupled between a second bit line of the bit line pair and the second dummy bit line of the dummy bit line pair. The second sharing switch is configured to control an electrical connection between the second bit line of the bit line pair and the second dummy bit line of the dummy bit line pair according the charge sharing control signal.

In accordance with some embodiments, a memory device includes a memory array and an operation assist circuit. The memory array includes a plurality of memory columns, where each of the plurality of memory columns comprises a bit line pair and a dummy bit line pair. The operation assist circuit includes a plurality of column assist circuits, where each of the plurality of column assist circuits corresponds to a corresponding memory column. Each of the plurality of column assist circuits includes a first precharge and equalization circuit, a first sharing switch and a second sharing switch. The first precharge and equalization circuit is coupled between a first dummy bit line and a second dummy bit line of the dummy bit line pair of the corresponding memory column, and is configured to precharge and equalize the first dummy bit line and the second dummy bit line of the dummy bit line pair. The first sharing switch is coupled between the first bit line of the bit line pair and a first dummy bit line of the dummy bit line pair of the corresponding memory column, and is configured to control an electrical connection between the first bit line of the bit line pair and the first dummy bit line of the dummy bit line pair according to a charge sharing control signal. The second sharing switch is coupled between a second bit line of the bit line pair and a second dummy bit line of the dummy bit line pair of the corresponding memory column. The second sharing switch is configured to control an electrical connection between the second bit line of the bit line pair and the second dummy bit line of the dummy bit line pair according to the charge sharing control signal.

In accordance with some embodiments, an operation assist method includes steps of selecting at least one memory column among a plurality of memory columns of a memory device for performing an operation; electrically disconnecting a bit line pair of the at least one selected memory column from a dummy bit line pair of the at least one selected memory column during an operation period when the operation is performed; and electrically connecting a bit line pair of the at least one unselected memory column among the plurality of memory column to a dummy bit line pair of the at least one unselected memory column during the operation period to add a capacitance value to the bit line pair of the at least one unselected memory column.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An operation assist circuit, comprising:
   a precharge and equalization circuit, coupled between a first dummy bit line and a second dummy bit line of a dummy bit line pair, and configured to precharge and equalize the first dummy bit line and the second dummy bit line; and
   a first sharing switch, coupled between a first bit line of a bit line pair and the first dummy bit line of the dummy bit line pair, and configured to control an electrical connection between the first bit line of the first bit line pair and the first dummy bit line of the dummy bit line pair according to a charge sharing control signal;
   a second sharing switch, coupled between a second bit line of the bit line pair and the second dummy bit line of the dummy bit line pair, and configured to control an electrical connection between the second bit line of the bit line pair and the second dummy bit line of the dummy bit line pair according the charge sharing control signal, wherein the plurality of memory columns comprise at least one selected memory column and at least one unselected column, the first sharing switch and the second sharing switch that are associated with the least one selected memory column are switched off during an operation period when the operation is performed, and the first sharing switch and the second sharing switch that are associated with the at least one unselected memory column are switched on during the operation period.

2. The operation assist circuit of claim 1, wherein the precharge and equalization circuit is configured to precharge and equalize the first dummy bit line and the second dummy bit line of the dummy bit line pair to a predetermined voltage level in a precharge period that is prior to the operation period.

3. The operation assist circuit of claim 1, wherein the precharge and equalization circuit comprises:
   a first transistor, coupled between the first dummy bit line and the second dummy bit line of the dummy bit line pair;
   a second transistor, coupled between a first reference node and a connection node of the first transistor and the first dummy bit line; and
   a third transistor, coupled between a second reference node and a connection node of the first transistor and the second dummy bit line,
   wherein a control terminal of the first transistor, a control terminal of the second transistor and a control terminal of the third transistor are coupled to receive a precharge and equalization control signal.

4. A memory device, comprising:
   a memory array, comprising a plurality of memory columns, wherein each of the plurality of memory columns comprises a bit line pair and a dummy bit line pair; and
   an operation assist circuit, comprising a plurality of column assist circuits, each of the plurality of column assist circuits corresponds to a corresponding memory column, wherein each of the plurality of column assist circuits comprises:
   a first precharge and equalization circuit, coupled between a first dummy bit line and a second dummy bit line of the dummy bit line pair of the corresponding memory column, and configured to precharge and equalize the first dummy bit line and the second dummy bit line of the dummy bit line pair; and
   a first sharing switch, coupled between a first bit line of the bit line pair and the first dummy bit line of the dummy bit line pair of the corresponding memory column, and configured to control an electrical connection between the first bit line of the bit line pair and the first dummy bit line of the dummy bit line pair according to a charge sharing control signal;
   a second sharing switch, coupled between a second bit line of the bit line pair and the second dummy bit line of the dummy bit line pair of the corresponding memory column, and configured to control an electrical connection between the second bit line of the bit line pair and the second dummy bit line of the dummy bit line pair according to the charge sharing control signal, wherein the plurality of memory columns comprise at least one selected memory column and at least one unselected memory column, the first sharing switch and the second sharing switch that are associated with the at least one selected memory column are switched off during an operation period when the operation is performed, and the first sharing switch and the second sharing switch that are associated with the at least one unselected memory column are switched on during the operation period.

5. The memory device of claim 4, wherein the first precharge and equalization circuit is configured to precharge and equalize the first dummy bit line and the second dummy bit line of the dummy bit line pair to a predetermined voltage level in a precharge period that is prior to the operation period.

6. The memory device of claim 5, wherein the first precharge and equalization circuit comprises:
   a first transistor, coupled between the first dummy bit line and the second dummy bit line of the dummy bit line pair;
   a second transistor, coupled between a first reference node and a connection node of the first transistor and the first dummy bit line; and
   a third transistor, coupled between a second reference node and a connection node of the first transistor and the second dummy bit line,
   wherein a control terminal of the first transistor, a control terminal of the second transistor and a control terminal of the third transistor are coupled to receive a precharge and equalization control signal.

7. The memory device of claim 6, further comprising:
a plurality of second precharge and equalization circuits, wherein
   each of the plurality of second precharge and equalization circuits corresponds to a corresponding memory column among the plurality of memory columns,
   each of the plurality of second precharge and equalization circuits is coupled between the first bit line and the second bit line of the bit line pair of the corresponding memory column, and
   each of the plurality of second precharge and equalization circuits is configured to precharge and equalize the first bit line and the second bit line of the bit line pair of the corresponding memory column in the precharge period.

8. The memory device of claim 7, further comprising:
a write driver, coupled to the plurality of memory columns of the memory array, configured to perform a write operation to at least one memory column according to a write control signal; and
a sense amplifier, coupled to the plurality of memory columns of the memory array, configured to perform a read operation to at least one memory column according to a read control signal.

9. The memory device of claim 8, wherein the write driver comprises a plurality of column write drivers, each of the plurality of column write drivers corresponds to one of the plurality of memory columns, each of the plurality of column write drivers comprises:
a first write driver, coupled to the first bit line of the bit line pair of the corresponding one of the plurality of memory columns; and
a second write driver, coupled to the second bit line of the bit line pair of the corresponding one of the plurality of memory columns,
wherein the first write driver and the second write driver are controlled by the write control signal.

10. The memory device of claim 8, wherein the sense amplifier comprises a plurality of transistor pairs, each of the plurality of transistor pairs corresponds to one of the plurality of memory columns, each of the plurality of transistor pairs comprises:
a first transistor, coupled to the first bit line of the bit line pair of the corresponding one of the plurality of memory columns;
a second transistor, coupled to the first bit line of the bit line pair of the corresponding one of the plurality of memory columns,
wherein the first transistor and the second transistor are controlled by the read control signal.

11. The memory device of claim 8, further comprising:
a control logic, coupled to the operation assist circuit, configured to generate the charge sharing control signal, the read control signal and the write control signal,
wherein the charge sharing control signal is generated according to a clock signal and a selection signal, and the read control signal and the write control signal are generated according to the clock signal, the selection signal and a decode signal.

12. The memory device of claim 4, wherein
the memory array is formed in a plurality of layers,
the bit line pair is formed in a first layer among the plurality of layers, and the dummy bit line pair is formed in a second layer that is different from the first layer of pair of bit lines.

13. An operation assist method, comprising:
selecting at least one memory column among a plurality of memory columns of a memory device for performing an operation;
electrically disconnecting a bit line pair of the at least one selected memory column from a dummy bit line pair of the at least one selected memory column during an operation period when the operation is performed; and
electrically connecting a bit line pair of the at least one unselected memory column among the plurality of memory column to a dummy bit line pair of the at least one unselected memory column during the operation period to add a capacitance value to the bit line pair of the at least one unselected memory column.

14. The operation assist method of claim 13, wherein electrically disconnecting the bit line pair of the at least one selected memory column from the dummy bit line pair of the at least one selected memory column during the operation period comprises:
switching off a first sharing switch that is associated with the at least one selected memory column to electrically disconnect a first bit line of the bit line pair of the at least one selected memory column from a first dummy bit line of the dummy bit line pair of the at least one selected memory column during the operation period; and
switching off a second sharing switch that is associated with the at least one selected memory column to electrically disconnect a second bit line of the bit line pair of the at least one selected memory column from a second dummy bit line of the dummy bit line pair of the at least one selected memory column during the operation period.

15. The operation assist method of claim 13, wherein electrically connecting the bit line pair of the at least one unselected memory column among the plurality of memory column from the dummy bit line pair of the at least one unselected memory column during the operation period comprises:
switching on a first sharing switch that is associated with the at least one unselected memory column to electrically connect a first bit line of the bit line pair of the at least one unselected memory column to a first dummy bit line of the dummy bit line pair of the at least one unselected memory column during the operation period; and
switching on a second sharing switch that is associated with the at least one unselected memory column to electrically connect a second bit line of the bit line pair of the at least one unselected memory column to a second dummy bit line of the dummy bit line pair of the at least one unselected memory column operation period.

16. The operation assist method of claim 13, further comprising:
precharging and equalizing the dummy bit line pair of each of the plurality of memory columns in a precharge period, wherein the precharge period is prior to the operation period.

17. The operation assist method of claim 16, wherein a first layer where the bit line pair of each of the plurality of memory columns is formed is different from a second layer where the dummy bit line pair of each of the plurality of memory columns is formed.

18. The operation assist method of claim 16, wherein the operation comprises a read operation or a write operation.

\* \* \* \* \*